United States Patent
Yi et al.

(10) Patent No.: US 8,349,200 B2
(45) Date of Patent: *Jan. 8, 2013

(54) METHOD OF FINE PATTERNING SEMICONDUCTOR DEVICE

(75) Inventors: Shi-Yong Yi, Seongnam (KR); Myeong-Cheol Kim, Suwon (KR); Dong-Ki Yoon, Seoul (KR); Kyung-Yub Jeon, Yongin (KR); Ji-Hoon Cha, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/217,544

(22) Filed: Aug. 25, 2011

(65) Prior Publication Data

US 2011/0312183 A1 Dec. 22, 2011

Related U.S. Application Data

(63) Continuation of application No. 12/217,784, filed on Jul. 9, 2008, now Pat. No. 8,029,688.

(30) Foreign Application Priority Data

Jan. 7, 2008 (KR) .................. 10-2008-0001824
Apr. 2, 2008 (KR) .................. 10-2008-0030784

(51) Int. Cl.
*B44C 1/22* (2006.01)
*C03C 15/00* (2006.01)
*C03C 25/68* (2006.01)
*C23F 1/00* (2006.01)

(52) U.S. Cl. .............. 216/47; 216/41; 216/46; 438/689
(58) Field of Classification Search ................ 216/46, 216/47, 41; 438/689
See application file for complete search history.

(56) References Cited

U.S. PATENT DOCUMENTS

2006/0216943 A1* 9/2006 Cho .............................. 438/754

OTHER PUBLICATIONS

Japanese Patent Publication No. 2002-198295 to Sato, having Publication date of Jul. 12, 2002 (w/ English Abstract page).
Japanese Patent Publication No. 2002-305187 to Ouchi et al., having Publication date of Oct. 18, 2002 (w/ English Abstract page).
Japanese Patent Publication No. 2006-140222 to Kiyono et al., having Publication date of Jun. 1, 2006 (w/ English Abstract page).

(Continued)

*Primary Examiner* — Roberts Culbert
(74) *Attorney, Agent, or Firm* — Monica H. Choi

(57) ABSTRACT

For patterning during integrated circuit fabrication, a first pattern of first masking structures is formed, and a buffer layer is formed on exposed surfaces of the first masking structures. Also, a second pattern of second masking structures is formed in recesses between the buffer layer at sidewalls of the first masking structures. Furthermore, the first and masking structures are formed from spin-coating respective high carbon containing materials. Such first and second masking structures pattern a target layer with higher pitch than possible with traditional photolithography.

15 Claims, 14 Drawing Sheets

OTHER PUBLICATIONS

Japanese Patent Publication No. 2006-261307 to Miyagawa et al., having Publication date of Sep. 28, 2006 (w/ English Abstract page).
Japanese Patent Publication No. 2006-303500 to Lee et al., having Publication date of Nov. 2, 2006 (w/ English Abstract page).
Japanese Patent Publication No. 2008-103718 to Jeon et al., having Publication date of May 1, 2008 (w/ English Abstract page).
Japanese Patent Publication No. 2008-512002 having Publication date of Apr. 17, 2008 (w/ English Abstract page).

* cited by examiner

METHOD OF FINE PATTERNING SEMICONDUCTOR DEVICE

CLAIM TO PRIORITY

The present application is a continuation of an earlier filed patent application with Ser. No. 12/217,784 filed on Jul. 9, 2008 now U.S. Pat. No. 8,029,688, for which priority is claimed. This earlier filed patent application with Ser. No. 12/217,784 is in its entirety incorporated herewith by reference.

The present application also claims priority under 35 USC §119 to Korean Patent Application No. 10-2008-0001824 filed on Jan. 7, 2008 and to Korean Patent Application No. 10-2008-0030784 filed on Apr. 2, 2008, in the Korean Intellectual Property Office, the disclosure of which are incorporated herein in its entirety by reference. A certified copy of Korean Patent Application Nos. 10-2008-0001824 and 10-2008-0030784 are contained in the parent patent application with Ser. No. 12/217,784.

TECHNICAL FIELD

The present invention relates generally to integrated circuit fabrication, and more particularly, to methods of fine patterning semiconductor devices.

BACKGROUND OF THE INVENTION

Integrated circuit (IC) dimensions are desired to be constantly scaled down with advancement of technology. Integrated circuits are traditionally patterned according to photolithography technology. However, photolithography technology is reaching limitations for achieving such ever smaller (IC) dimensions into the nanometers range.

For example, line resolution and line edge roughness are limited by the large size of polymer molecules of photo-resist material. In addition, a photo-resist structure that is tall and thin is prone to pattern collapse.

Accordingly, double patterning technology using spacers has emerged to achieve smaller IC dimensions as illustrated in FIGS. 1A, 1B, 1C, 1D, 1E, and 1F. Referring to FIG. 1A, a target layer 102 to be patterned is formed on a semiconductor substrate 104 such as a silicon substrate. A first mask pattern 106 having a first pitch is formed on the target layer 102. Thereafter in FIG. 1B, a layer of spacer material 108 is deposited on exposed surfaces including sidewalls and top surfaces of the first mask pattern 106.

Subsequently referring to FIG. 1C, the spacer material 108 is anisotropically etched to form spacers 110 from the spacer material 108 remaining at sidewalls of the first mask pattern 106. Thereafter referring to FIG. 1D, a second mask material 112 is blanket deposited to fill in the spaces between the spacers 110. Further in FIG. 1E, the second mask material 112 is etched down until the second mask material 112 remaining between the spacers 110 form a second mask pattern 114. Subsequently in FIG. 1F, the spacers 110 are removed such that a final mask pattern is formed from the first and second mask patterns 106 and 114. Such a final mask pattern 106 and 114 is used to pattern the target layer 102 with a pitch that is twice the pitch of the first mask pattern 106 alone or twice the pitch of the second mask pattern 114 alone.

Referring to FIG. 2 for reverse patterning technology using spacers, subsequently after the spacers 110 are formed in FIG. 1C, the first mask pattern 106 is etched away such that just the spacers 110 remain. The remaining spacers 110 are used as the final mask pattern for patterning the target layer 102. Such a final mask pattern 110 has a pitch that is twice the pitch of the first mask pattern 106.

However, such double or reverse patterning technologies of the prior art have high production cost, long production time, and void formation in openings with high aspect ratio. Thus, U.S. Pat. No. 7,312,158 to Miyagawa et al. discloses use of a buffer layer to achieve higher pitch in forming a final mask pattern. However, material to surround such a buffer layer in Miyagawa et al. is deposited using CVD (chemical vapor deposition) which is still prone to void formation in openings with high aspect ratio.

Thus, patterning with fine pitch is desired with prevention of void formation in openings with high aspect ratio.

SUMMARY OF THE INVENTION

Accordingly, in a method of patterning during integrated circuit fabrication according to an aspect of the present invention, a first pattern of first masking structures is formed, and a buffer layer is formed on exposed surfaces of the first masking structures. In addition, a second pattern of second masking structures is formed in recesses between the buffer layer at sidewalls of the first masking structures. Furthermore, each of at least one of the first masking structures and the second masking structures are formed from spin-coating a respective material.

In an example embodiment of the present invention, each of the first masking structures and the second masking structures are comprised of a respective high carbon content material having from about 85 weight percent to about 99 weight percent of carbon. In that case, the step of forming the first masking structures includes the steps of spin-coating an organic compound material over a semiconductor substrate, and heating the organic compound material at a temperature of from about 300° Celsius to about 550° Celsius for from about 30 seconds to about 300 seconds to form a hardened organic compound layer. The hardened organic compound layer is then patterned to form the first masking structures.

In an example embodiment of the present invention, the step of forming the first masking structures further includes heating the organic compound material at a temperature of from about 150° Celsius to about 350° Celsius for about 60 seconds after the step of spin-coating the organic compound material. In that case, the hardened organic compound layer is patterned with a photo-resist pattern to form the first masking structures, and a first pitch of the photo-resist pattern is greater than a second pitch between the first and second masking structures.

In another embodiment of the present invention, the first and second masking structures have a same width, and a thickness of the buffer layer is substantially same as the width of the first and second masking structures.

In a further embodiment of the present invention, a hard mask layer is deposited over the hardened organic compound layer, and a photo-resist pattern is formed over the hard mask layer. Exposed regions of the hard mask layer are etched to form a hard mask pattern, and the hardened organic compound layer is patterned with the hard mask pattern to form the first masking structures.

In another embodiment of the present invention, the step of forming the second masking structures includes spin-coating an organic compound material over the buffer layer, and heating the organic compound material at a temperature of from about 300° Celsius to about 550° Celsius for from about 30 seconds to about 300 seconds to form a hardened organic compound layer. In addition, portions of the hardened organic compound layer are etched away until portions of the hardened organic compound layer disposed in the recesses between the buffer layer at the sidewalls of the first masking structures remain to form the second masking structures. In addition, the organic compound material is heated at a temperature of from about 150° Celsius to about 350° Celsius for about 60 seconds after the step of spin-coating the organic compound material.

In a further embodiment of the present invention, portions of the buffer layer not disposed under the second masking structures are etched away. In addition, a hard mask layer disposed under the first and second masking structures are patterned such that portions of the hard mask layer disposed under the first masking structures and the second masking structures remain to form a hard mask pattern. Additionally, the first and second masking structures are removed simultaneously using an ashing and/or stripping process.

In another embodiment of the present invention, a partial depth of exposed portions of the hard mask layer is etched away when the first masking structures are patterned. The buffer layer is deposited on exposed portions of the first masking structures and exposed portions of the hard mask layer.

In a further embodiment of the present invention, at least one target layer disposed under the hard mask pattern is patterned. For example, the at least one target layer includes a semiconductor substrate. Alternatively, the at least one target layer includes a conductive material.

In another embodiment of the present invention, the first masking structures are disposed over remaining portions of the hard mask layer, and the second masking structures are disposed over remaining portions of the buffer layer and the hard mask layer. In addition, a top hard mask layer is patterned over the first masking structures, and a first top height of the top hard mask layer over the first masking structures is substantially same as a second top height of the second masking structures.

In a further embodiment of the present invention, each of the first and second masking structures is formed to have a same initial width that is greater than a thickness of the buffer layer. In addition, sidewalls of the first and second masking structures are etched away during etching of the buffer layer such that the first and second masking structures each have a final width that is less than the initial width.

According to a method of patterning during integrated circuit fabrication according to another embodiment of the present invention, a first pattern of first masking structures is formed, and a buffer layer is formed on exposed surfaces of the first masking structures. Also, a second pattern of second masking structures is formed in recesses between the buffer layer at sidewalls of the first masking structures. Each of the first masking structures and the second masking structures is comprised of a respective carbon containing material.

For example, each respective carbon containing material has from about 85 weight percent to about 99 weight percent of carbon. Alternatively, both of the first masking structures and the second masking structures are comprised of a substantially same high carbon content material.

In an example embodiment of the present invention, the first masking structures and the second masking structures have a same etch selectivity.

In a further embodiment of the present invention, each of the first and second masking structures has a width that is substantially equal to a thickness of the buffer layer. Alternatively, each of the first and second masking structures has a width that is greater than a thickness of the buffer layer.

In this manner, the target layer is patterned with a pitch that is twice the pitch that is possible according to traditional photolithography. In addition, the first and second masking structures are formed from spin-coating respective high carbon content materials to avoid void formation in openings with high aspect ratio. In addition, such first and second masking structures may be removed with aching and stripping. Thus, patterning of integrated circuit structures with small dimensions is achieved with low cost and reduced void formation.

These and other features and advantages of the present invention will be better understood by considering the following detailed description of the invention which is presented with the attached drawings.

The figures referred to herein are drawn for clarity of illustration and are not necessarily drawn to scale. The same reference number in FIGS. 1A, 1B, 1C, 1D, 1E, 1F, 2, 3A, 3B, 3C, 3D, 3E, 3F, 3G, 3H, 3I, 3J, 4, 5, 6A, 6B, 6C, 6D, 6E, 6F, 6G, 6H, 7A, 7B, 7C, 7D, 7E, and 7F refer to elements having similar structure and/or function.

DETAILED DESCRIPTION

FIGS. 3A, 3B, 3C, 3D, 3E, 3F, 3G, 3H, 3I, and 3J show cross-sectional views for patterning of a target layer 202 using a buffer layer and spin coated materials to avoid void formation, according to a first embodiment of the present invention.

Figure 1A:
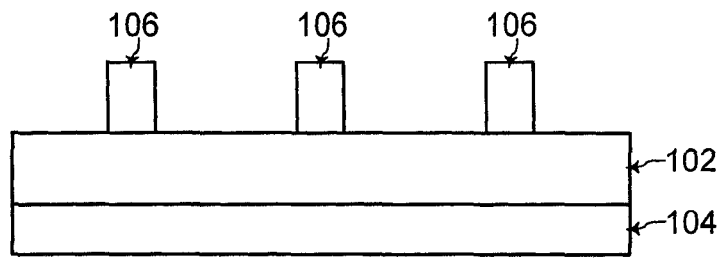
FIGS. 1A, 1B, 1C, 1D, 1E, and 1F show cross-sectional views during double patterning using spacers, according to the prior art.
Figure 1B:
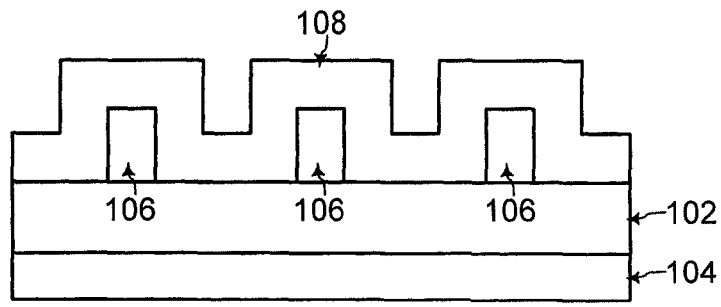
Figure 1C:
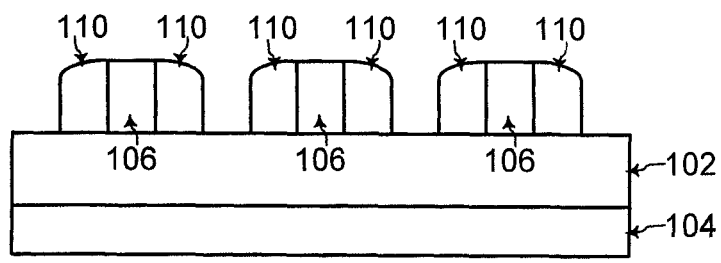
Figure 1D:
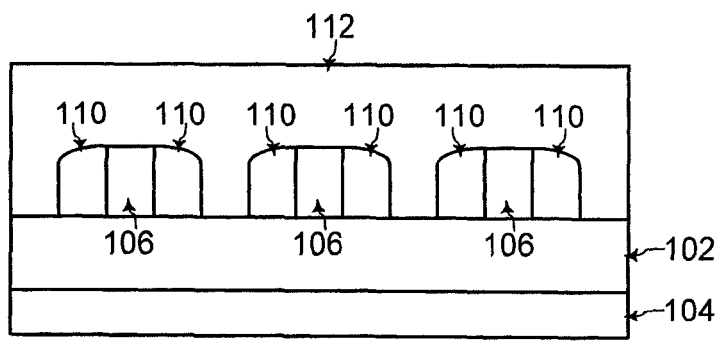
Figure 1E:
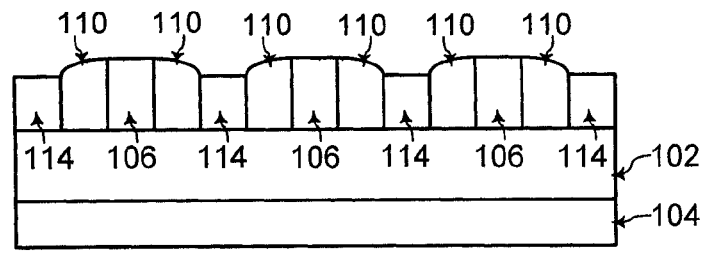
Figure 1F:
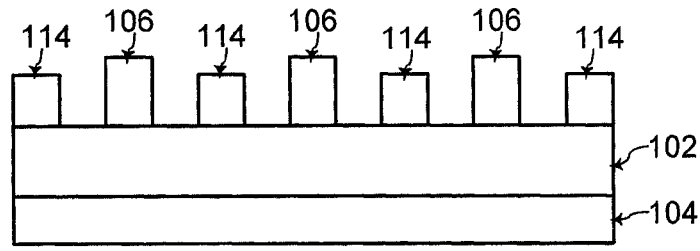
Figure 2:
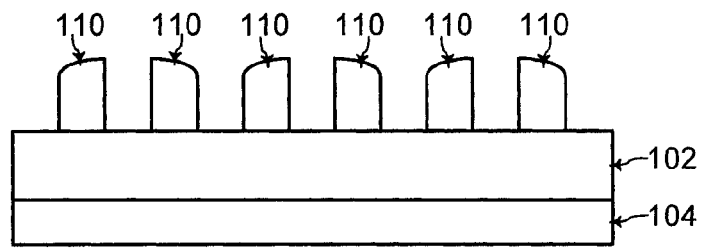
FIG. 2 shows a cross-sectional view during reverse patterning using spacers, according to the prior art.
Figure 3A:
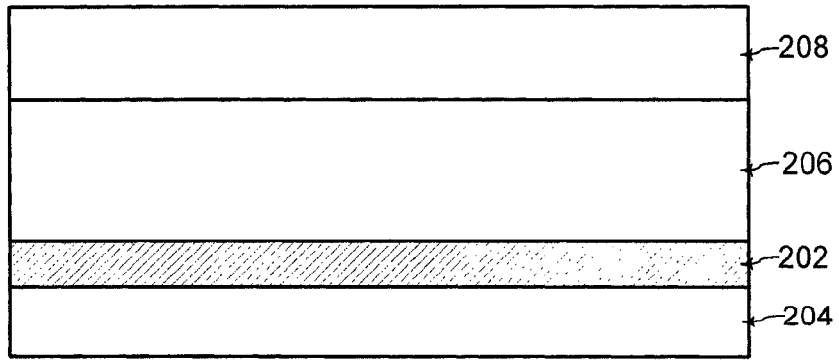
FIGS. 3A, 3B, 3C, 3D, 3E, 3F, 3G, 3H, 3I, and 3J show cross-sectional views during patterning using a buffer layer and spin coated materials, according to a first embodiment of the present invention.

Referring to FIG. 3A, a target layer 202 is deposited on a semiconductor substrate 204 such as a silicon substrate for example. The target layer 202 may be comprised of a conductive material such as doped polysilicon or a stack of doped polysilicon and a metal silicide for patterning gate electrodes from the target layer 202. Alternatively, the target layer 202 may be comprised of a metal such as tungsten or aluminum or a metal alloy for patterning a bit line from the target layer 202. The present invention may also be practiced with the target layer 202 being omitted when the substrate 204 is desired to be patterned.

Further referring to FIG. 3A, a first hard mask layer 206 is formed on the target layer 202. The first hard mask layer 206 and the target layer 202 are formed of respective materials having different etch selectivities with respect to a predetermined etch solution or predetermined etch gas. For example, the first hard mask layer 206 is comprised of one of a plasma enhanced oxide (PEOX), a thermal oxide, a chemical vapor deposition (CVD) oxide, an undoped silicate glass (USG), or a high density plasma (HDP) oxide. Alternatively, the first hard mask layer 206 is comprised of a nitride material such as silicon oxynitride (SiON), silicon nitride (SiN), silicon boron nitride (SiBN), or boron nitride (BN), for example.

Also referring to FIG. 3A, a first spin-coated layer 208 is formed on the first hard mask layer 206. In an example embodiment of the present invention, the first spin-coated layer 208 is comprised of a hydrocarbon compound including an aromatic ring or an organic compound comprising a derivative thereof. For example, the first spin-coated layer 208 is comprised of an organic compound having an aromatic ring such as phenyl, benzene, or naphthalene. In any case, the first spin-coated layer 208 is comprised of a high carbon containing material having from about 85% to about 99% weight percent of carbon, according to an example embodiment of the present invention.

Figure 4:
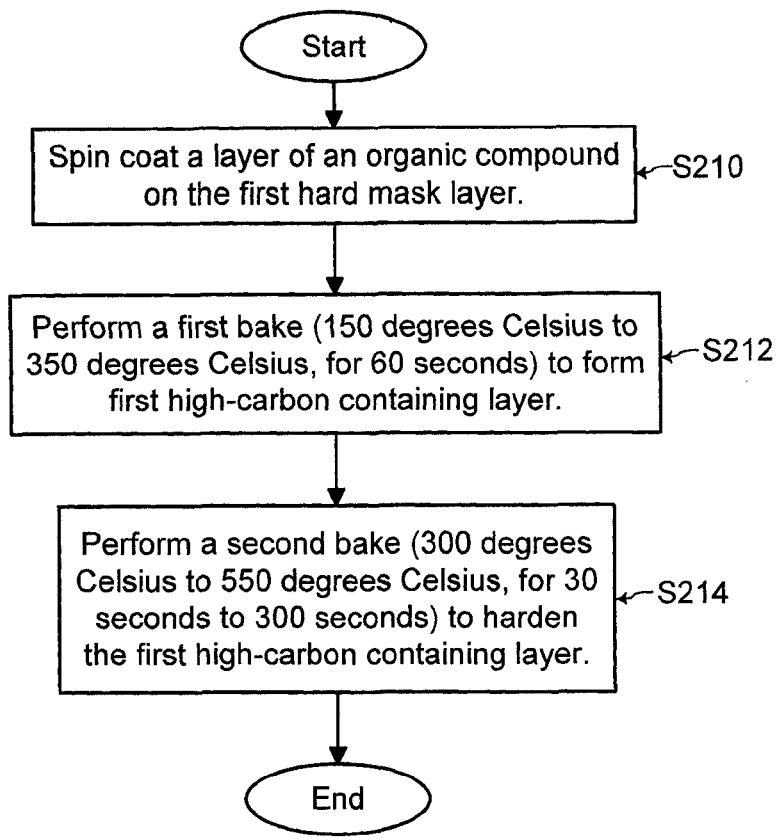
FIGS. 4 and 5 show flow-charts of steps for spin-coating high carbon-containing material in FIGS. 3A and 3F, according to an embodiment of the present invention.

The first spin-coated layer 208 is formed on the first hard mask layer 206 according to the steps of the flow-chart of FIG. 4, according to an example embodiment of the present invention. Referring to FIGS. 3A and 4, an organic compound material is spin-coated onto the first hard mask layer 206 with a thickness of from about 1,000 angstroms to about 1,500 angstroms in an example embodiment of the present invention (step S210 of FIG. 4). Subsequently, a first bake is performed for heating the organic compound material to a temperature of from about 150° Celsius to about 350° Celsius for about 60 seconds to form the first spin-coated layer 208 that is also a first high carbon containing layer (step S212 of FIG. 4). Such heating hardens the organic compound material of the first spin-coated layer 208.

Thereafter, a second bake is performed to further harden the first high carbon containing layer 208 by again heating the first high carbon containing layer 208 to a temperature of from about 300° Celsius to about 550° Celsius for from about 30 seconds to about 300 seconds (step S214 of FIG. 4). Such a second bake that further hardens the first high carbon containing layer 208 is advantageous for preventing adverse effects on the first high carbon containing layer 208 during subsequent high temperature processes performed at 400° Celsius or higher.

Subsequently referring to FIG. 3B, a second hard mask layer 216 is formed on the first high carbon containing layer 208. In addition, the present invention may be practiced with an anti-reflective layer (not shown in FIG. 3B) being formed on the second hard mask layer 216. However, an anti-reflective layer is not formed when the second hard mask layer 216 is comprised of an anti-reflective material such as an organic layer containing silicon and carbon that is deposited by spin-coating. Alternatively, the second hard mask layer 216 is comprised of silicon oxynitride (SiON) deposited by chemical vapor deposition (CVD).

Figure 3B:
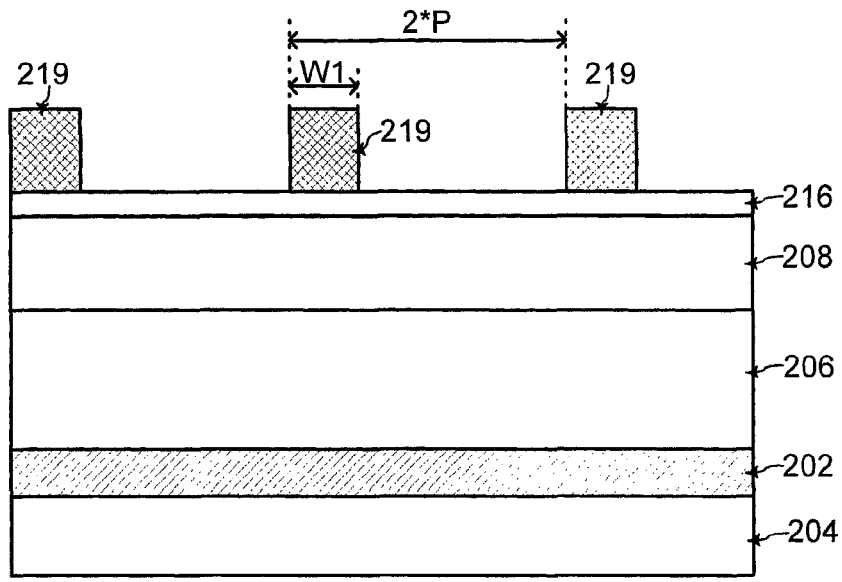

Also referring to FIG. 3B, a photo-resist pattern comprised of photo-resist structures 219 is formed on the second hard mask layer 216 with a pitch of 2*P, with P being a desired pitch of structures to be patterned with the target layer 202. Each of the photo-resist structures 219 has a first width W1 that is greater than or equal to a desired width of the structures to be patterned with the target layer 202.

Figure 3C:
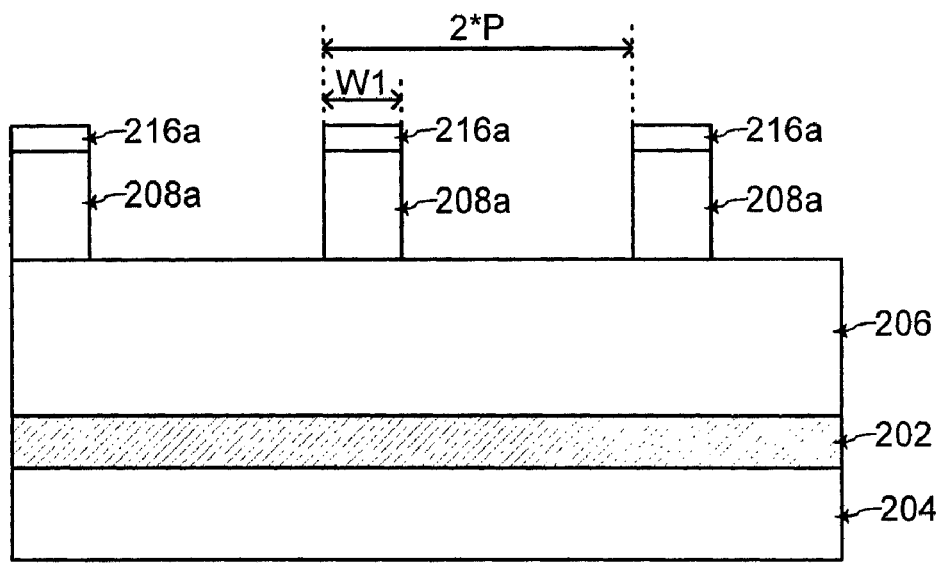

Thereafter referring to FIG. 3C, exposed portions of the second hard mask layer 216 and the first high carbon containing layer 208 are etched away to form first high carbon containing structures (i.e., first masking structures) 208a and second hard mask structures 216a. The photo-resist structures 219 are completely removed during such etching, and the second hard mask structures 216a may be partially or completely removed during such etching. The first high carbon containing structures 208a have a pitch of 2*P. The second hard mask structures 216a may act as an etch mask during patterning of the first masking structures 208a.

Subsequently referring to FIG. 3D, exposed portions of the first hard mask layer 206 are partially etched down to a depth of d to expose recess bottom surfaces 217 of the first hard mask layer 206. In an alternative embodiment of the present invention, the first hard mask layer 206 may be comprised of an upper layer and a lower layer having different etch selectivities. In that case, the upper layer is formed to have a thickness of d, and exposed portions of the upper layer would be etched away.

Figure 3D:
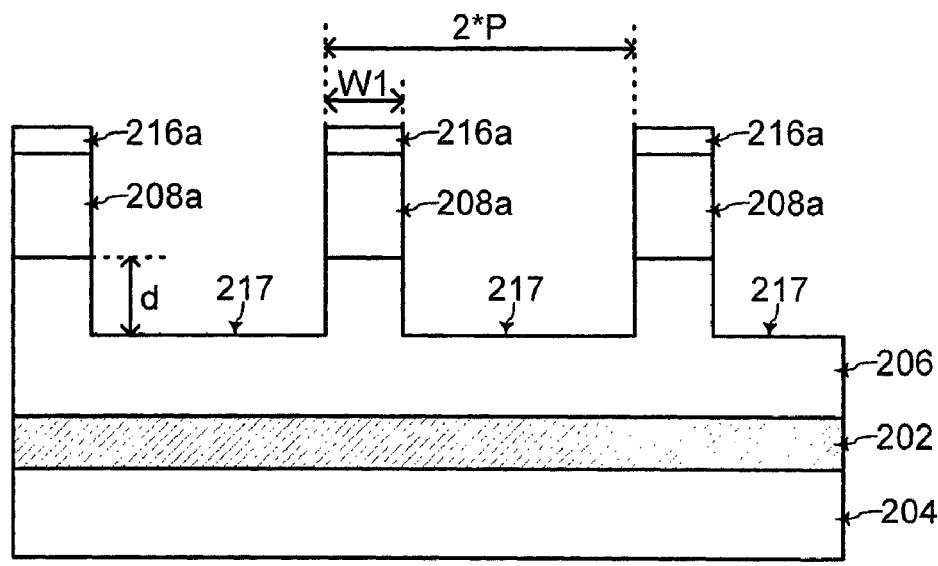
Figure 3E:
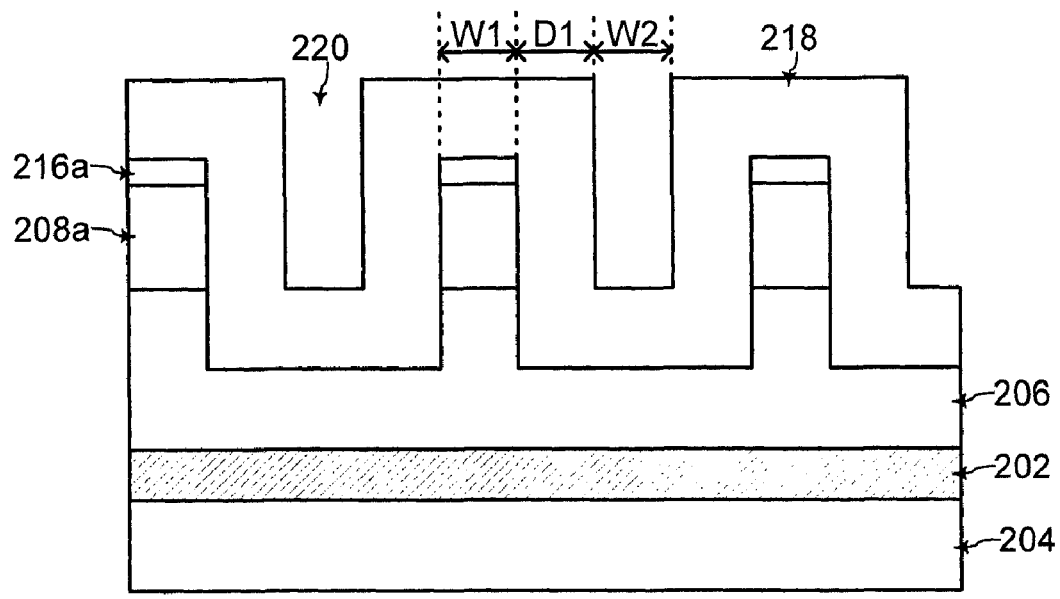

Thereafter referring to FIG. 3E, a buffer layer 218 is formed on exposed surfaces of the second hard mask structures 216a, the first high carbon containing structures 208a, and the first hard mask layer 206. The buffer layer 218 is deposited to have a uniform thickness D1 that is substantially equal to the depth d of FIG. 3D in one embodiment of the present invention. The buffer layer 218 may be an oxide formed by atomic layer deposition (ALD). Openings 220 having a second width W2 are formed between portions of the buffer layer 218. In an example embodiment of the present invention, W1=W2=D1. In that case, W1, W2, and D1 are each ¼ of 2*P of FIG. 3D.

Figure 3F:
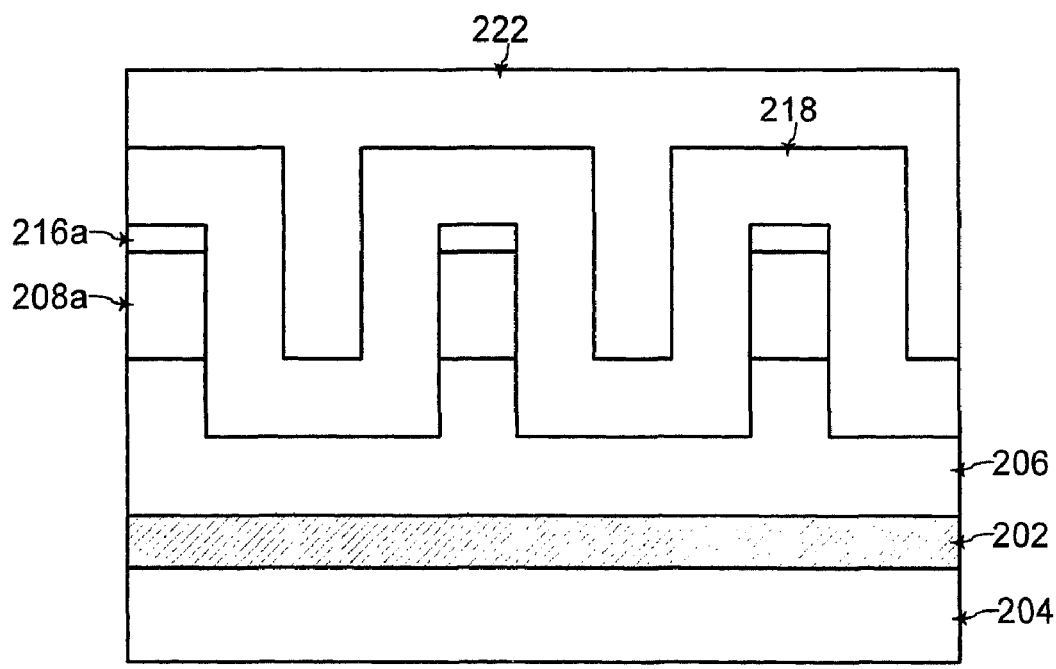

Subsequently referring to FIG. 3F, a second spin-coated layer 222 is formed to fill the openings 220 and on the buffer layer 218. In an example embodiment of the present invention, the second spin-coated layer 222 is comprised of a hydrocarbon compound including an aromatic ring or an organic compound comprising a derivative thereof. For example, the second spin-coated layer 222 is comprised of an organic compound having an aromatic ring such as phenyl, benzene, or naphthalene. In any case, the second spin-coated layer 222 is comprised of a high carbon containing material having from about 85% to about 99% weight percent of carbon, according to an example embodiment of the present invention.

Figure 5:
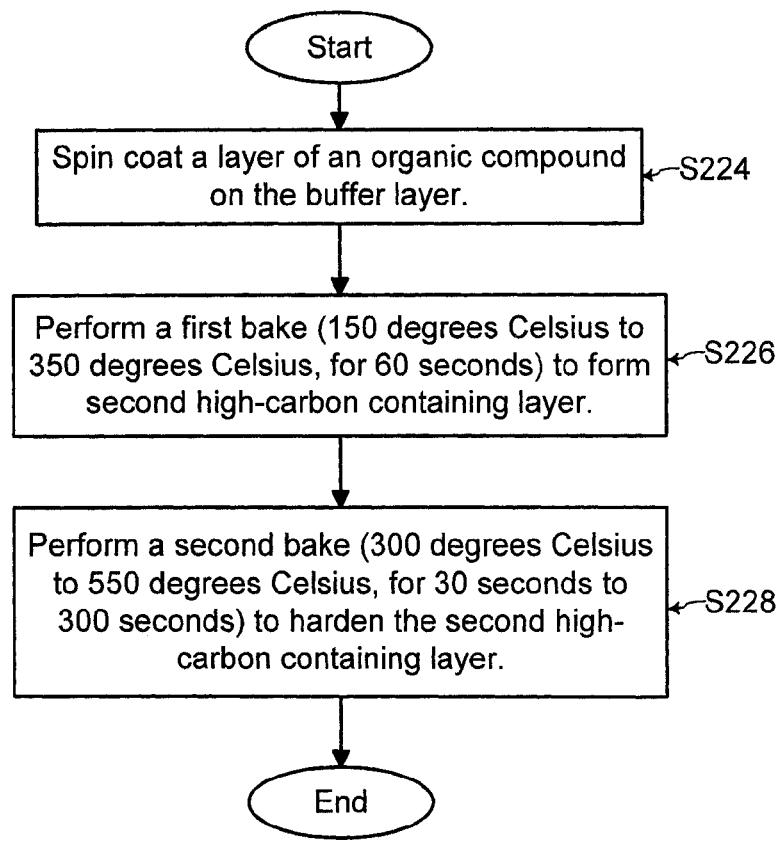

The second spin-coated layer 222 is formed on the buffer layer 218 according to the steps of the flow-chart of FIG. 5, according to an example embodiment of the present invention. Referring to FIGS. 3F and 5, an organic compound material is spin-coated onto the buffer layer 218 with a thickness of from about 1,000 angstroms to about 1,500 angstroms in an example embodiment of the present invention (step S224 of FIG. 5). Subsequently, a first bake is performed for heating the organic compound material to a temperature of from about 150° Celsius to about 350° Celsius for about 60 seconds to form the second spin-coated layer 222 that is also a second high carbon containing layer (step S226 of FIG. 5). Such heating hardens the organic compound material of the second spin-coated layer 222.

Thereafter, a second bake is performed to further harden the second high carbon containing layer 222 by again heating the second high carbon containing layer 222 to a temperature of from about 300° Celsius to about 550° Celsius for from about 30 seconds to about 300 seconds (step S228 of FIG. 5). Such a second bake that further hardens the second high carbon containing layer 222 is advantageous for preventing adverse effects on the second high carbon containing layer 222 during subsequent high temperature processes performed at 400° Celsius or higher.

Figure 3G:
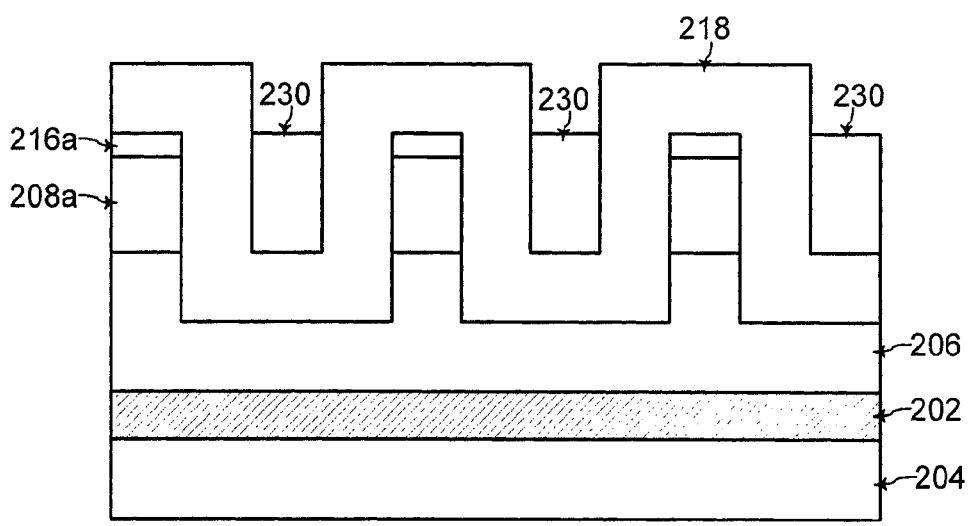

Subsequently referring to FIG. 3G, a top portion of the second high carbon containing layer 222 is etched away by a wet etch process or an etch back process until top portions of the buffer layer 218 are exposed. Thus, second high carbon containing structures (i.e., second masking structures) 230 are formed from portions of the second high carbon containing material 222 remaining within the openings 220.

Figure 3H:
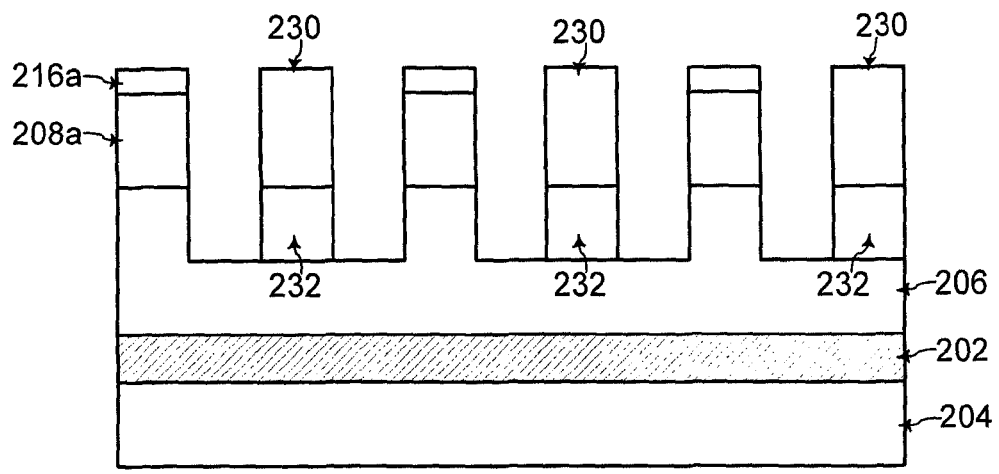

Thereafter referring to FIG. 3H, the buffer layer 218 is anisotropically etched with the second high carbon containing structures 230 being used as an etch mask until the recess bottom surfaces 217 of the first hard mask layer 206 are exposed. Thus, buffer structures 232 comprised of the remaining portions of the buffer layer 218 are formed under the second high carbon containing structures 230.

Referring to FIGS. 3D, 3E, and 3H, because the thickness D1 of the buffer layer 218 is equal to the depth d in FIG. 3D, the second hard mask structures 216a and the second high carbon containing structures 230 have same top heights, in an embodiment of the present invention. In addition, note that the widths of the first high carbon containing structures 208a and the second high carbon containing structures 230 may be controlled to have the width W1 of FIG. 3C or a width that is smaller than W1 by appropriately setting the etching characteristics during the anisotropic etching of the buffer layer 218.

Figure 3I:
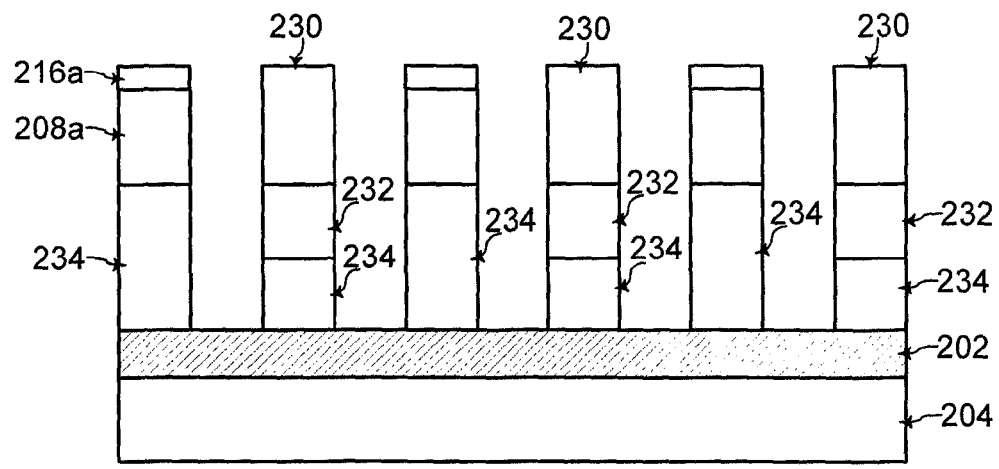

Subsequently referring to FIG. 3I, exposed portions of the first hard mask layer 206 are anisotropically etched away until portions of the target layer 202 are exposed. Thus, a first hard mask pattern 234 is formed from portions of the first hard mask layer 206 remaining under the buffer structures 232 and under the first high carbon containing structures 208a.

Figure 3J:
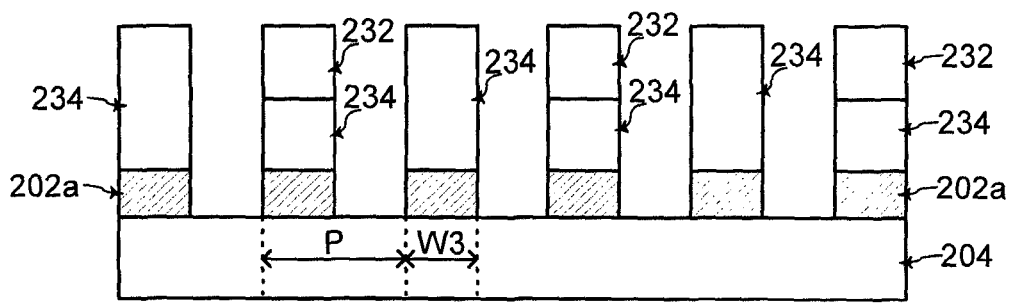

Thereafter referring to FIG. 3J, exposed portions of the target layer 202 are anisotropically etched away to form target pattern structures 202a. In such an anisotropic etching of the target layer 202, the first high carbon containing structures 208a, the second hard mask structures 216a, the second high carbon containing structures 230, the buffer structures 232, and the first hard mask pattern 234 are used as an etch mask.

However referring to FIG. 3J, the second hard mask structures 216a, the first high carbon containing structures 208a, and the second high carbon containing structures 230 are etched away during patterning of the target layer 202. Further referring to FIG. 3J, the target pattern structures 202a form a target pattern having a pitch of P that is ½ of the pitch 2*P of FIG. 3C, and each of the target pattern structures 202a has a respective final width W4 that is less than or equal to the initial width W1 in FIG. 3C. Also referring to FIG. 3J, if the target layer 202 is omitted, the substrate 204 may be patterned with the first high carbon containing structures 208a, the second hard mask structures 216a, the second high carbon containing structures 230, the buffer structures 232, and the first hard mask pattern 234 being used as an etch mask.

FIGS. 6A, 6B, 6C, 6D, 6E, 6F, 6G, and 6H show cross-sectional views for patterning of a target layer 302 using a buffer layer and spin coated materials, according to a second embodiment of the present invention.

Figure 6A:
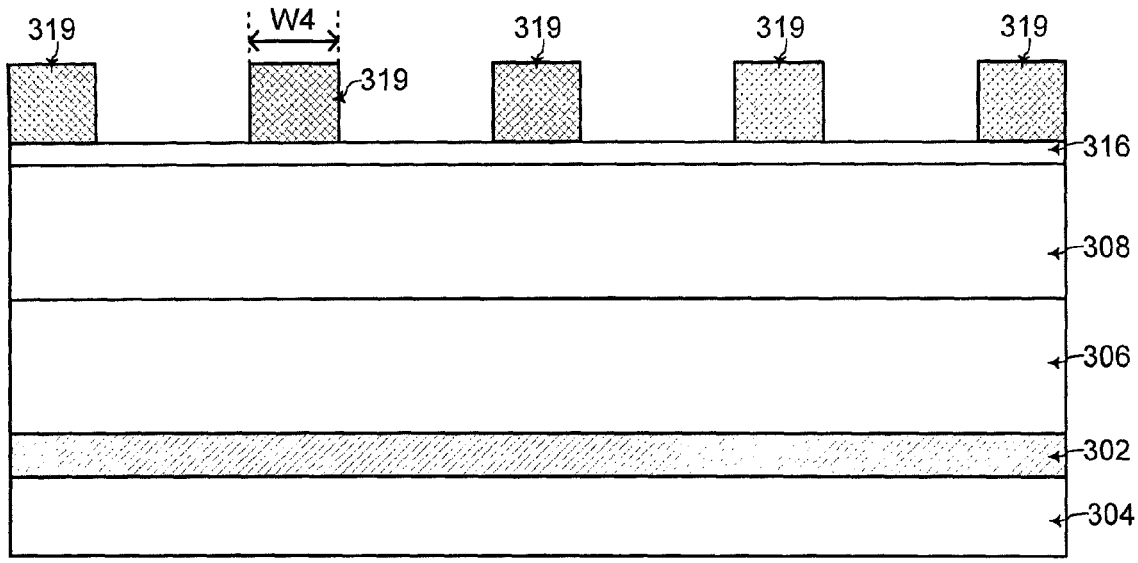
FIGS. 6A, 6B, 6C, 6D, 6E, 6F, 6G, and 6H show cross-sectional views during patterning using a buffer layer and spin coated materials, according to a second embodiment of the present invention.

Referring to FIG. 6A, the target layer 302 is formed on a semiconductor substrate 304 that may be a silicon substrate. In addition, a first hard mask layer 306 is formed on the target layer 302, a first spin-coated layer 308 is formed on the first hard mask layer 306, and a second hard mask layer 316 is formed on the first spin-coated layer 308.

Furthermore, a photo-resist pattern comprised of photo-resist structures 319 is formed on the second hard mask layer 316, and each photo-resist structure 319 has a width W4. The first hard mask layer 306, the first high carbon containing layer 308, and the second hard mask layer 316 in FIG. 6A are formed similarly as described for the first hard mask layer 206, the first high carbon containing layer 208, and the second hard mask layer 216, respectively, in FIG. 3B. For example, the first spin-coated layer 308 of FIG. 6B is similar to the first high carbon containing layer 208 of FIG. 3B, both being formed similarly according to the flow-chart of FIG. 4.

Subsequently referring to FIG. 6B, exposed portions of the second hard mask layer 316 and the first high carbon containing layer 308 are etched away to form first high carbon containing structures (i.e., first masking structures) 308a and second hard mask structures 316a. The photo-resist structures 319 are completely removed during such etching, and the second hard mask structures 316a may be partially or completely removed during such etching.

Figure 6B:
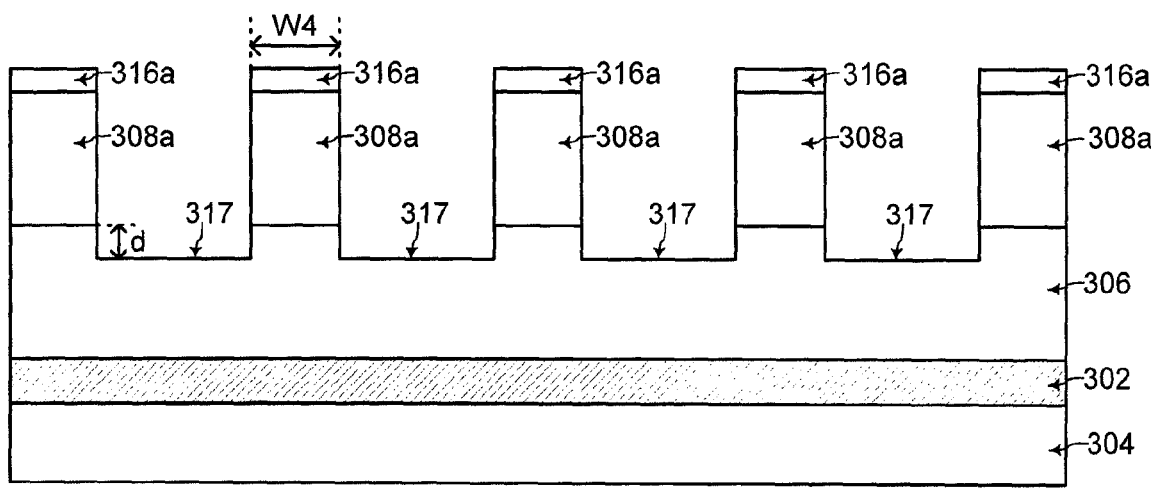

Also referring to FIG. 6B, exposed portions of the first hard mask layer 306 are partially etched down to a depth of d to expose recess bottom surfaces 317 of the first hard mask layer 306. In an example embodiment of the present invention, the depth d is less than the width W4 of the first high carbon containing structures 308a. In an alternative embodiment of the present invention, the process of etching the depth d of the first hard mask layer 306 may be omitted.

Figure 6C:
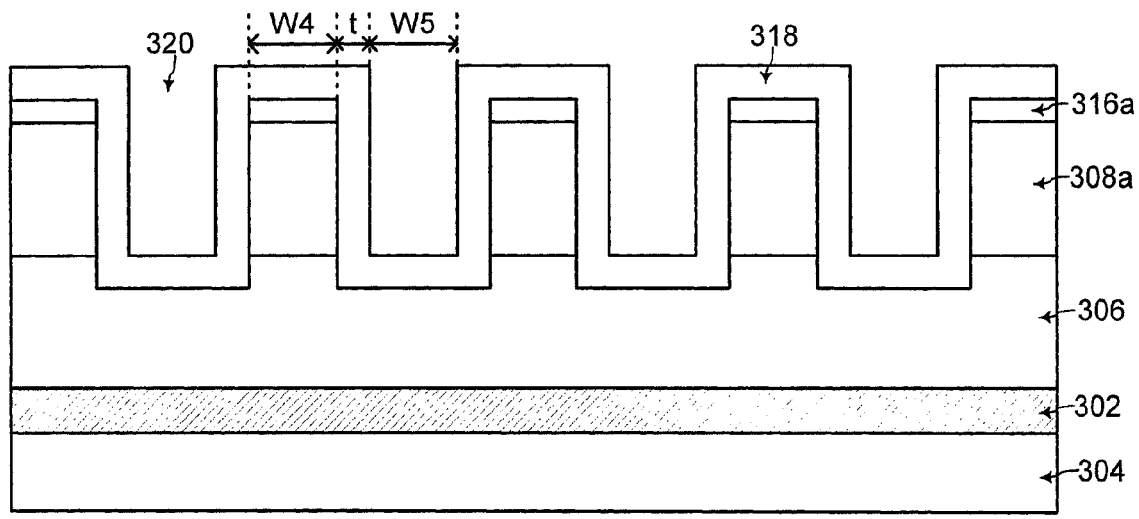

Thereafter referring to FIG. 6C, a buffer layer 318 is formed on exposed surfaces of the second hard mask structures 316a, the first high carbon containing structures 308a, and the first hard mask layer 306. The buffer layer 318 is deposited to have a uniform thickness t that is substantially equal to the depth d of FIG. 6B in one embodiment of the present invention. The buffer layer 318 may be an oxide formed by atomic layer deposition (ALD). Openings 320 having a width W5 are formed between portions of the buffer layer 318. In an example embodiment of the present invention, W4=W5, and t is substantially less than each of W4 and W5 such from about 1.5 times to about 10 times less than each of W4 and W5.

Figure 6D:
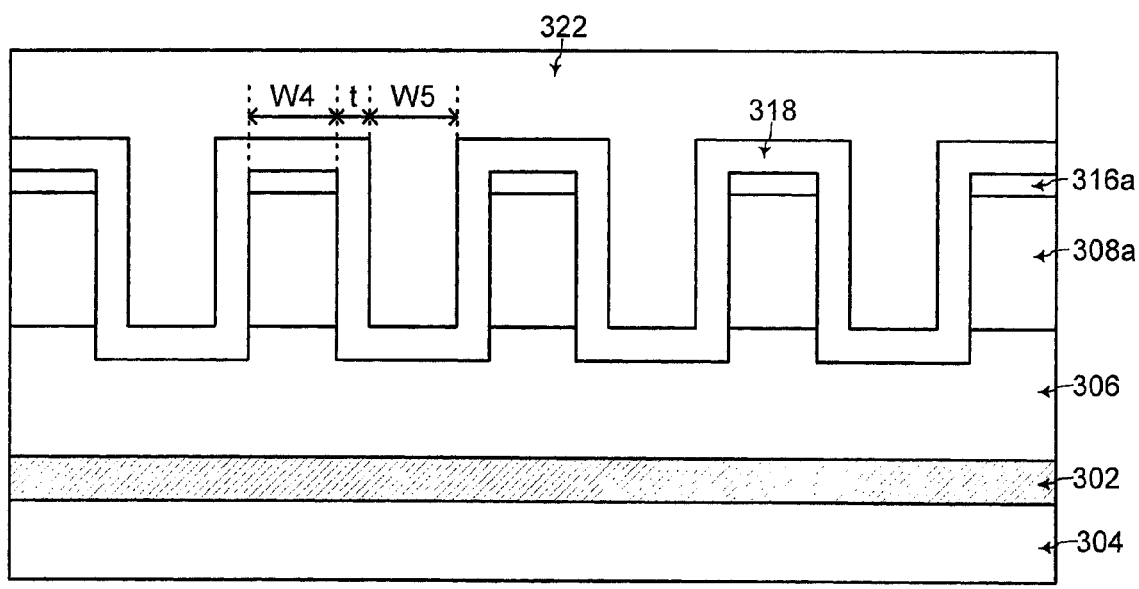

Subsequently referring to FIG. 6D, a second spin-coated layer 322 is formed to fill the openings 320 and on the buffer layer 318. In an example embodiment of the present invention, the second spin-coated layer 322 of FIG. 6D is similar to the second spin-coated layer 222 of FIG. 3F, both being formed similarly according to the flow-chart of FIG. 5.

Figure 6E:
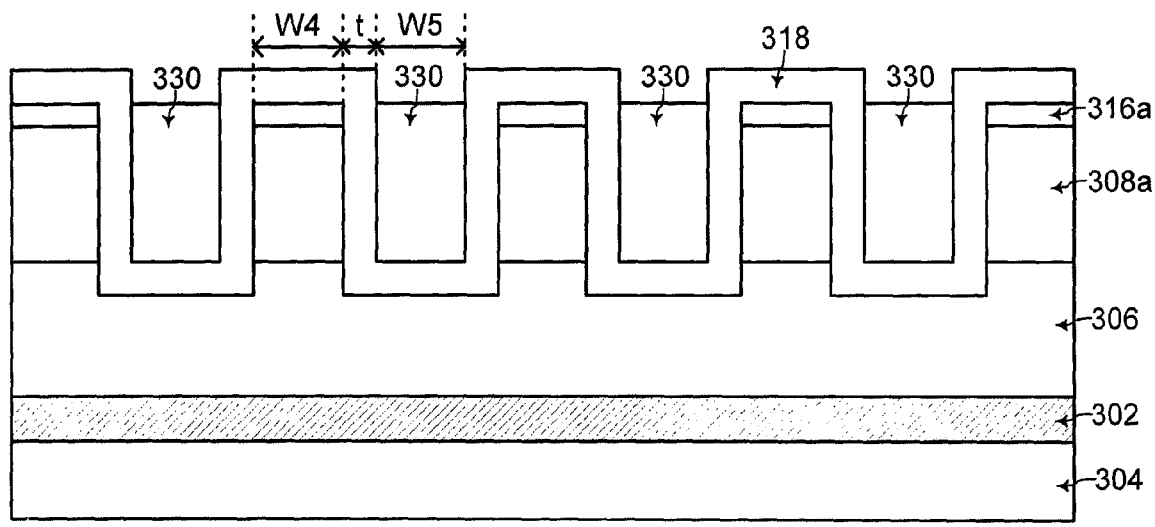

Thereafter referring to FIG. 6E, a top portion of the second high carbon containing layer 322 is etched away by a wet etch process or an etch back process until top portions of the buffer layer 318 are exposed. Thus, second high carbon containing structures (i.e., second masking structures) 330 are formed from portions of the second high containing material 222 remaining within the openings 320.

Subsequently referring to FIG. 6F, a top portion of the buffer layer 318 is isotropically etched. Next referring to FIG. 6G, exposed portions of the buffer layer 318 are anisotropically etched with the second high carbon containing structures 330 being used as an etch mask until the recess bottom surfaces 317 of the first hard mask layer 306 are exposed. Thus, buffer structures 332 comprised of the remaining portions of the buffer layer 318 are formed under the second high carbon containing structures 330.

Figure 6F:
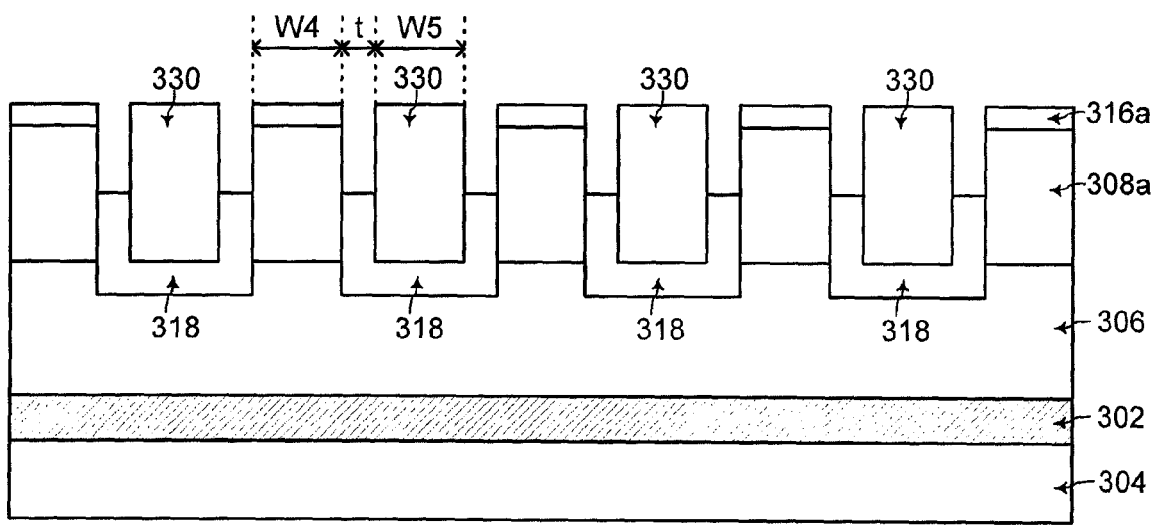
Figure 6G:
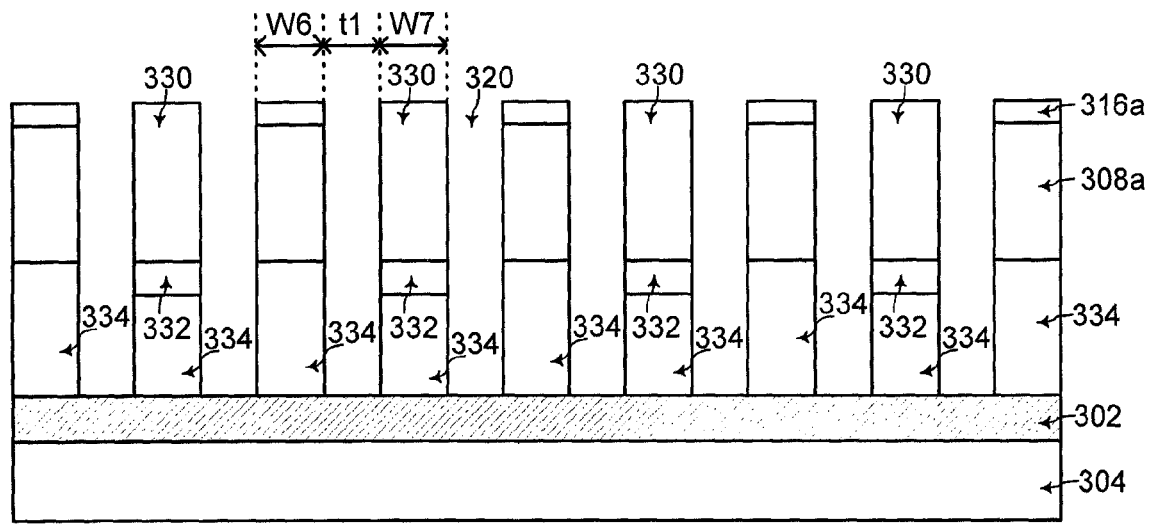

Further referring to FIGS. 6F and 6G, if the buffer layer 318 and the first hard mask layer 306 are comprised of a same material or similar material having substantially equal etch selectivities during etching of the buffer layer 318, the first hard mask layer 306 is etched in situ during the anisotropic etching of the buffer layer 318. Thus, exposed portions of the first hard mask layer 306 are also anisotropically etched away until portions of the target layer 302 are exposed. Thus in FIG. 6G, a first hard mask pattern 334 is formed from portions of the first hard mask layer 306 remaining under the buffer structures 332 and under the first high carbon containing structures 308a.

In addition in FIG. 6G, each of the first high carbon containing structures 308a has a respective width W6, and each of the second high carbon containing structures 330 has a respective width W7. Each of such widths W6 and W7 may be controlled by setting the etch conditions during the anisotropic etching of the buffer layer 318 and the first hard mask layer 306 in FIG. 6G. For example, each of the widths W6 and W7 in FIG. 6G has been reduced from each of the widths W4 and W5 of FIG. 6F from etching of the exposed sidewalls during the anisotropic etching of the buffer layer 318. In addition, a new width t1 of the openings 320 in FIG. 6G has been increased from the width t of the openings 320 in FIG. 6F.

Figure 6H:
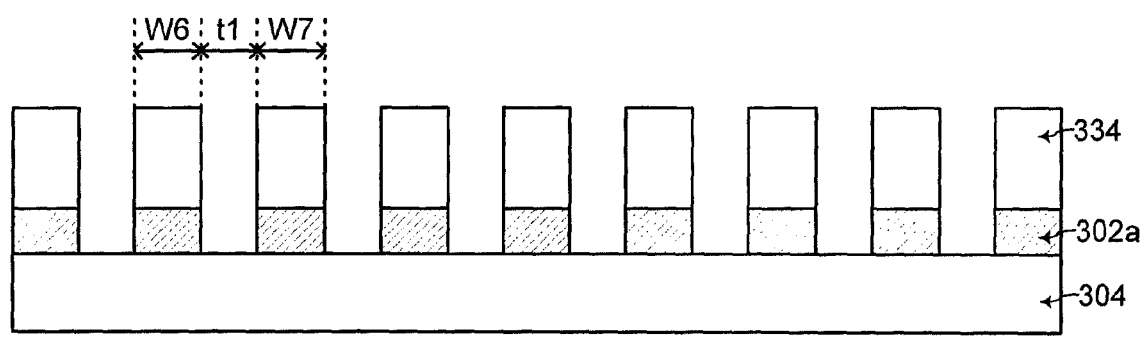

Thereafter referring to FIG. 6H, exposed portions of the target layer 302 are anisotropically etched away to form target pattern structures 302a. In such an anisotropic etching of the target layer 302, the first high carbon containing structures 308a, the second hard mask structures 316a, the second high carbon containing structures 330, the buffer structures 332, and the first hard mask pattern 334 are used as an etch mask.

However referring to FIG. 6H, the second hard mask structures 316a, the first high carbon containing structures 308a, and the second high carbon containing structures 330 are etched away during patterning of the target layer 302. Further referring to FIG. 6H, the target pattern structures 302a are formed more densely than the photo-resist structures 319 of FIG. 6A. Also referring to FIG. 6H, if the target layer 302 is omitted, the substrate 304 may be patterned with the first high carbon containing structures 308a, the second hard mask structures 316a, the second high carbon containing structures 330, the buffer structures 332, and the first hard mask pattern 334 being used as an etch mask.

FIGS. 7A, 7B, 7C, 7D, 7E, and 7F show cross-sectional views during patterning of shallow trench isolation structures using a buffer layer and spin coated materials, according to a third embodiment of the present invention.

Figure 7A:
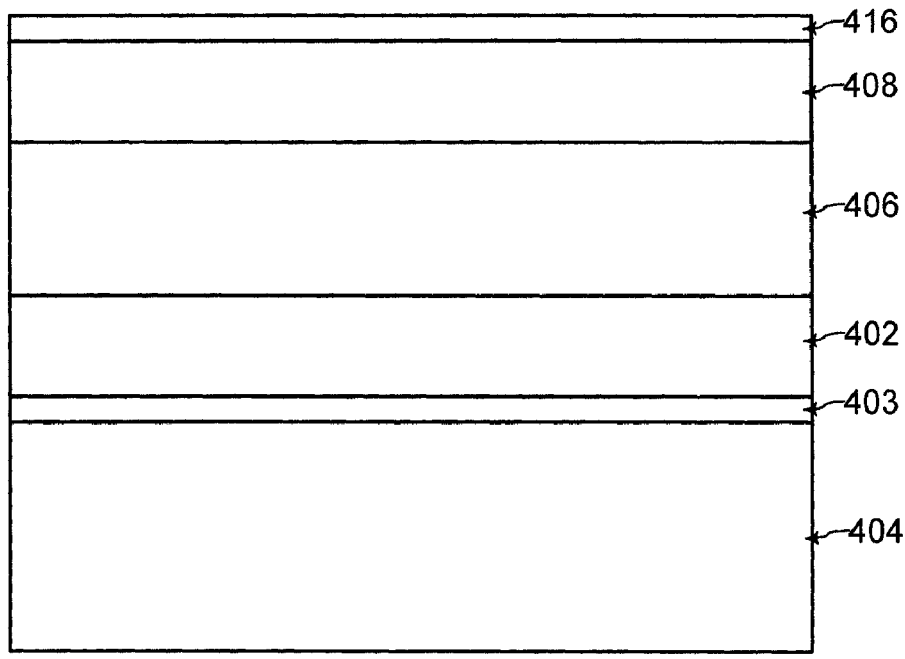
FIGS. 7A, 7B, 7C, 7D, 7E, and 7F show cross-sectional views during patterning for shallow trench isolation structures using a buffer layer and spin coated materials, according to a third embodiment of the present invention.

Referring to FIG. 7A, a pad oxide film 403 is formed on a semiconductor substrate 404 that may be a silicon substrate. In addition, a nitride layer 402 is formed on the pad oxide film 403. Thereafter, a first hard mask layer 406 is formed on the nitride layer 402, and a first spin-coated layer 408 is formed on the first hard mask layer 406. A second hard mask layer 416 is formed on the first spin-coated layer 408.

The first hard mask layer 406, the first high carbon containing layer 408, and the second hard mask layer 416 in FIG. 7A are formed similarly as described for the first hard mask layer 206, the first high carbon containing layer 208, and the second hard mask layer 216, respectively, in FIG. 3B. For example, the first spin-coated layer 408 of FIG. 7A is similar to the first high carbon containing layer 208 of FIG. 3B, both being formed similarly according to the flow-chart of FIG. 4.

Figure 7B:
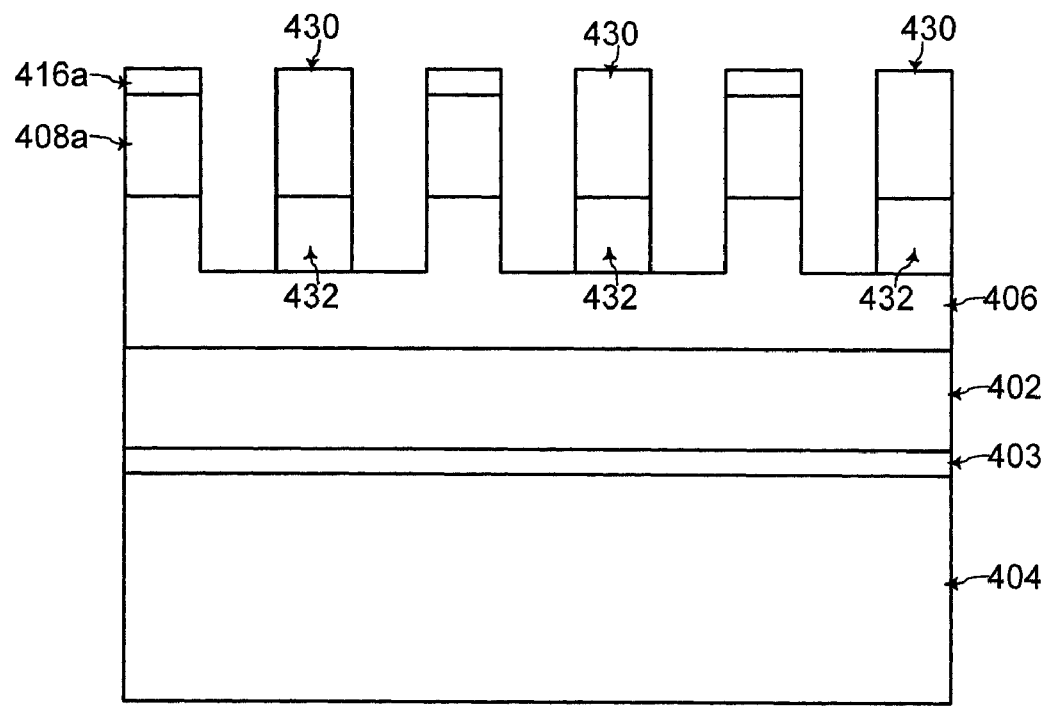

Thereafter referring to FIG. 7B, the second hard mask layer 416 and the first high carbon containing layer 408 are patterned to form the second hard mask structures 416a and the first high carbon containing structures (i.e., first masking structures) 408a. In addition in FIG. 7B similar to FIG. 3I, second high carbon containing structures (i.e., second masking structures) 430 are formed by patterning from a second high carbon containing layer formed similarly according to FIG. 5. Also in FIG. 7B similar to FIG. 3I, buffer structures 432 comprised of remaining portions of a buffer layer are formed under the second high carbon containing structures 430.

Figure 7C:
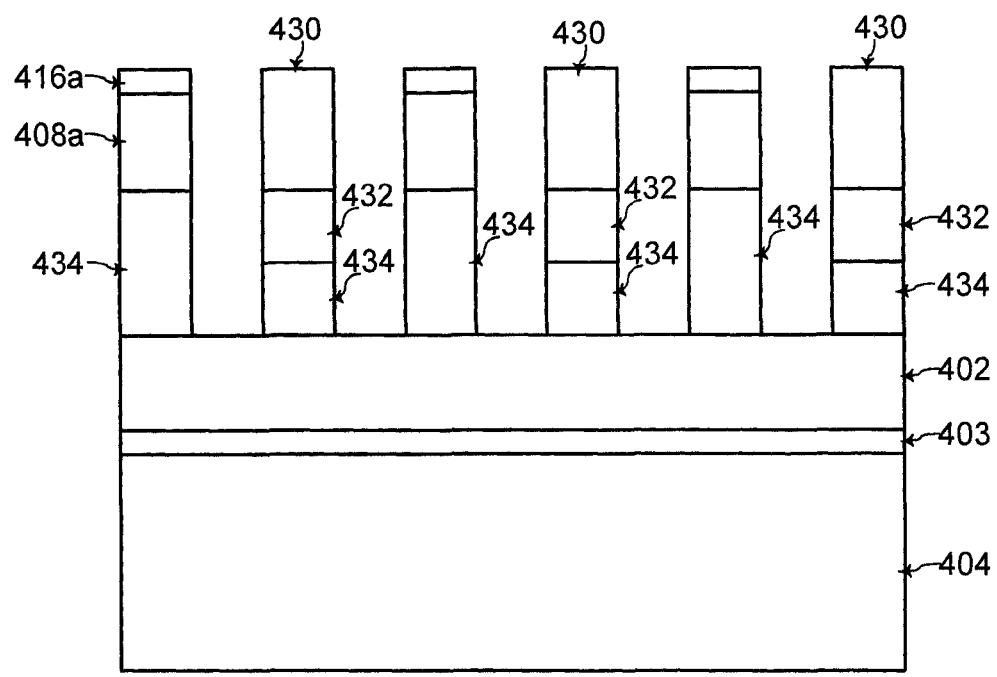

Subsequently referring to FIG. 7C similar to FIG. 3I, exposed portions of the first hard mask layer 406 are anisotropically etched away until portions of the nitride layer 402 are exposed. Thus, a first hard mask pattern 434 is formed from portions of the first hard mask layer 406 remaining under the buffer structures 432 and under the first high carbon containing structures 408a.

Figure 7D:
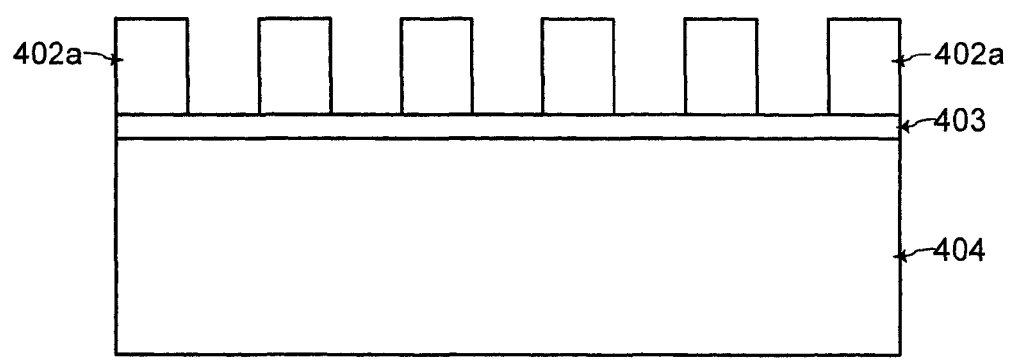

Thereafter referring to FIG. 7D similar to 3J, exposed portions of the nitride layer 402 are anisotropically etched away to form nitride pattern structures 402a. In such an anisotropic etching of the nitride layer 402, the first high carbon containing structures 408a, the second hard mask structures 416a, the second high carbon containing structures 430, the buffer structures 432, and the first hard mask pattern 434 are used as an etch mask. However referring to FIGS. 7C and 7D, the second hard mask structures 416a, the first high carbon containing structures 408a, the second high carbon containing structures 430, the buffer structures 432, and the first hard mask pattern 434 are etched away during patterning of the nitride layer 402.

Figure 7E:
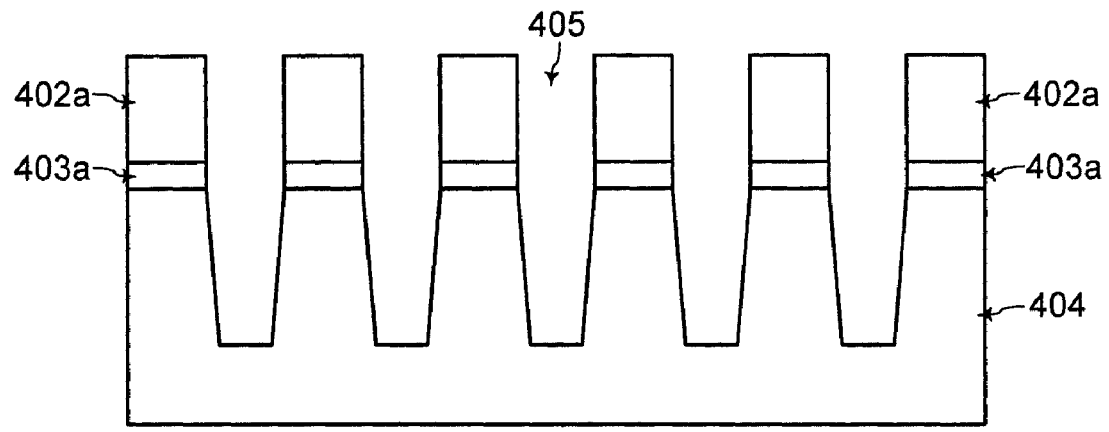
Figure 7F:
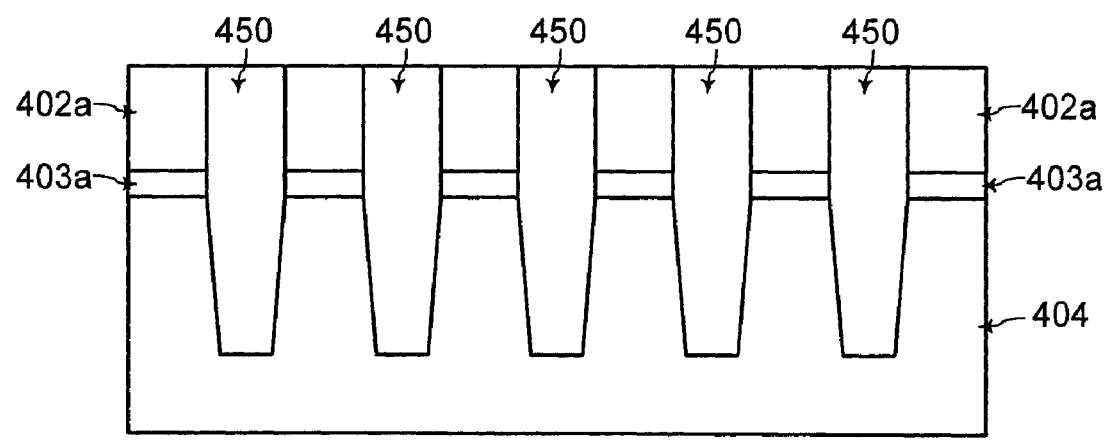

Subsequently referring to FIG. 7E, exposed portions of the pad oxide film 403 and the semiconductor substrate 404 are etched away to form STI (shallow trench isolation) openings 405. Thereafter referring to FIG. 7F, the STI openings 405 are filled with an insulating material to form STI (shallow trench isolation) structures 450.

In this manner, the target layer 202 or 302 or the semiconductor substrate 404 is patterned with a final pitch that is higher such as twice an initial pitch that is possible according to traditional photolithography. In addition, the first and second high carbon containing structures are first and second masking structures that are formed from spin-coating respective high carbon content materials to avoid void formation in openings with high aspect ratio. In addition, such first and second masking structures that may be comprised of a same high carbon containing material may be simultaneously removed with ashing and stripping which is a low-cost and efficient removal process. Thus, patterning of integrated circuit structures with small dimensions is achieved with low cost and reduced void formation.

The foregoing is by way of example only and is not intended to be limiting. Thus, any dimensions or number of elements or any materials as illustrated and described herein are by way of example only. The present invention is limited only as defined in the following claims and equivalents thereof.

The invention claimed is:

1. A method of patterning during integrated circuit fabrication, the method comprising:
    forming a first pattern of first masking structures, wherein the forming of the first pattern of the first masking structures comprises spin-coating an organic compound material over a semiconductor substrate to form an organic compound layer, and forming a first hard mask pattern on the organic compound layer;
    forming a buffer layer on exposed surfaces of the first masking structures; and
    forming a second pattern of second masking structures in recesses between the buffer layer at sidewalls of the first masking structures.

2. The method of claim 1, wherein the second masking structures are formed from spin-coating a material.

3. The method of claim 1, wherein each of at least one of the first masking structures and the second masking structures are comprised of a respective carbon containing material.

4. The method of claim 1, wherein each of the first and second masking structures has a width that is substantially equal to a thickness of the buffer layer.

5. The method of claim 1, wherein the step of forming the buffer layer comprises forming the buffer layer on exposed surfaces of the first masking structures and the first hard mask pattern.

6. The method of claim 1, wherein a first top height of the first pattern of the first masking structures is substantially same as a second top height of the second masking structures.

7. The method of claim 1, further comprising:
    etching away portions of the buffer layer not disposed under the second masking structures.

8. The method of claim 7, further comprising:
patterning a second hard mask layer disposed under the first and second masking structures, such that portions of the second hard mask layer disposed under the first masking structures and the second masking structures remain to form a second hard mask pattern.

9. The method of claim 8, further comprising:
removing the first and second masking structures simultaneously using an ashing and/or stripping process.

10. The method of claim 8, further comprising:
etching away a partial depth of exposed portions of the second hard mask layer when the first masking structures are patterned,
wherein the buffer layer is deposited on exposed portions of the first masking structures and exposed portions of the second hard mask layer.

11. The method of claim 8, further comprising:
patterning at least one target layer disposed under the second hard mask pattern.

12. A method of patterning during integrated circuit fabrication, the method comprising:
forming a first pattern of first masking structures on a first hard mask layer, wherein the first hard mask layer is recessed;
forming a buffer layer on exposed surfaces of the first masking structures and the first hard mask layer; and
forming a second pattern of second masking structures between the buffer layer at sidewalls of the first masking structures and the first hard mask layer.

13. The method of claim 12, wherein each of at least one of the first masking structures and the second masking structures are formed from spin-coating a respective material.

14. The method of claim 12, wherein each of at least one of the first masking structures and the second masking structures are comprised of a respective carbon containing material.

15. The method of claim 12, wherein the forming of the first masking structures comprises spin-coating an organic compound material over a semiconductor substrate to form an organic compound layer, and forming a second hard mask pattern on the organic compound layer.

* * * * *